(12) United States Patent
Tronstad et al.

(10) Patent No.: US 8,147,605 B2
(45) Date of Patent: Apr. 3, 2012

(54) COATING COMPOSITION FOR A MOULD

(75) Inventors: Ragnar Tronstad, Sogne (NO); Erik Enebakk, Kristiansand (NO)

(73) Assignee: Elkem Solar AS, Oslo (NO)

( * ) Notice: Subject to any disclaimer, the term of this patent is extended or adjusted under 35 U.S.C. 154(b) by 0 days.

(21) Appl. No.: 12/532,719

(22) PCT Filed: Mar. 17, 2008

(86) PCT No.: PCT/NO2008/000103
§ 371 (c)(1),
(2), (4) Date: Jan. 20, 2010

(87) PCT Pub. No.: WO2008/118023
PCT Pub. Date: Oct. 2, 2008

(65) Prior Publication Data
US 2010/0133415 A1 Jun. 3, 2010

(30) Foreign Application Priority Data
Mar. 26, 2007 (NO) .................................. 20071562

(51) Int. Cl.
*B28B 7/00* (2006.01)
*B29C 33/56* (2006.01)
*B29C 33/60* (2006.01)

(52) U.S. Cl. .................. 106/38.22; 106/38.2; 106/38.27; 106/38.28; 106/38.9; 106/287.11

(58) Field of Classification Search ................. 106/38.2, 106/38.22, 287.11, 38.27, 38.28, 38.9
See application file for complete search history.

(56) References Cited

U.S. PATENT DOCUMENTS

| | | | |
|---|---|---|---|
| 4,099,924 A | 7/1978 | Berkman et al. | |
| 4,356,152 A | 10/1982 | Berkman et al. | |
| 4,428,916 A * | 1/1984 | Komeya et al. | 423/344 |
| 5,431,869 A | 7/1995 | Kumar et al. | |
| 5,529,666 A * | 6/1996 | Yesnik | 162/136 |
| 5,643,843 A * | 7/1997 | Dunmead et al. | 501/92 |
| 5,730,792 A * | 3/1998 | Camilletti et al. | 106/287.14 |
| 6,395,662 B1 * | 5/2002 | Li et al. | 501/127 |
| 6,732,992 B2 * | 5/2004 | Wakita et al. | 249/112 |
| 6,896,968 B2 * | 5/2005 | Golecki | 428/446 |
| 2004/0211496 A1 | 10/2004 | Khattak et al. | |
| 2006/0057317 A1 | 3/2006 | Shimizu et al. | |
| 2007/0013098 A1 | 1/2007 | Schwertfeger et al. | |

FOREIGN PATENT DOCUMENTS

| | | | |
|---|---|---|---|
| EP | 206795 | * | 12/1986 |
| EP | 1739209 A | | 1/2007 |
| JP | 56032397 | | 4/1981 |
| JP | 63-162511 A | * | 7/1988 |
| JP | 64-009806 A | * | 11/1989 |
| JP | 2000202835 A | | 7/2000 |
| JP | 2006218537 | | 8/2006 |
| WO | 99/05338 A | | 2/1999 |

\* cited by examiner

*Primary Examiner* — Anthony J Green
(74) *Attorney, Agent, or Firm* — Lucas & Mercanti, LLP

(57) ABSTRACT

A coating system for a mould for the directional solidification of silicon. The coating is applied as an aqueous slurry of silicon nitride particle, carbon black and microsilica.

21 Claims, No Drawings

COATING COMPOSITION FOR A MOULD

This application is a 371 of PCT/NO2008/000103 filed Mar. 17, 2008, which in turn claims the priority of NO 20071562 filed Mar. 26, 2007, the priority of both applications is hereby claimed and both applications are incorporated by reference herein.

TECHNICAL FIELD

The present invention relates to a coating system for moulds used in the directional solidification of silicon ingots, and also a method of coating such moulds. The invention is particularly, but not exclusively, concerned with high purity silicon for use in solar cells.

BACKGROUND ART

When silicon is subjected to directional solidification in moulds e.g. graphite moulds, the moulds would have to be coated in order to avoid contamination of the silicon ingot from contact with the mould material. It is also important that the silicon ingot is easily removed from the mould after solidification without damaging or even destroying the mould. The moulds are therefore coated, generally with silicon nitride particles, which may be sprayed, painted or otherwise applied, in the form of a slurry, on to the inner surface of the moulds.

In the case of graphite moulds, it has been observed that they often break during solidification of the silicon ingot due to the fact that silicon is a material which expands on solidification from liquid. If a mould breaks during solidification, it cannot be reused. Furthermore, and more importantly, there may be leakage of liquid silicon during the solidification process which may destroy the furnace in which the mould is located during the process. For economical reasons it is very important that graphite moulds (and moulds made from other materials) can be reused many times.

U.S. Pat. No. 5,431,869 describes a mould treatment in which the mould is first coated with a $Si_3N_4$ powder and then an alkaline earth metal halide melt film is additionally formed between the silicon nitride powder coating and the silicon melt. This procedure is, however, costly, and contaminates the silicon melt in an undesirable way with alkaline earth metal and, possibly, with other impurities from the alkaline earth metal halide mixture used.

U.S. Pat. No. 6,615,425 describes a process in which a mould is coated with $Si_3N_4$ powder having a particular particle aspect ratio and oxygen content. It may be applied as an aqueous dispersion. However, the performance is not entirely satisfactory in that the coating is sometimes porous and allows infiltration of liquid metal in the coating.

It is therefore an object of the invention to provide a coating system for a mould which more reliably prevents damage to the mould material while at the same time enabling release of a silicon ingot from the mould without damage to the mould.

DESCRIPTION OF INVENTION

According to the invention, there is provided a coating composition for a mould for the directional solidification of silicon, which comprises silicon nitride particles, a source of carbon and an oxide and/or silicon powder.

The mould is preferably of a ceramic material, such as glassy carbon, silica, silicon nitride, or mullite, but the preferred material is graphite.

Preferably, in the coating composition, the carbon represents from 0.5 to 20 wt %, any oxide represents 1 to 50 wt %, any silicon represents 1 to 20 wt % and silicon nitride represents at least 50 wt % and is the balance of the composition. The preferred oxide is $SiO_2$ and its preferred form is amorphous microsilica and amorphous fumed silica.

The term "microsilica" used in the specification and claims of this application is particulate to amorphous $SiO_2$ obtained from a process in which silica (quartz) is reduced to SiO-gas and the reduction product is oxidised in vapour phase to form amorphous silica. Microsilica may contain at least 70% by weight silica ($SiO_2$) and has a specific density of 2.1-2.3 $g/cm^3$ and a surface area of 15-40 $m^2/g$. The primary particles are substantially spherical and have an average size of about 0.15 μm. Microsilica is preferably obtained as a co-product in the production of silicon or silicon alloys in electric reduction furnaces. In these processes large quantities of microsilica are formed. The microsilica is recovered in conventional manner using baghouse filters or other collection apparatus.

Other possible oxides include crystalline $SiO_2$, Ca containing oxide compounds, alumina and oxides of rare earths and oxides of transition metals.

Preferably, the carbon is carbon black, though other sources of carbon may be employed, such as graphite powder. Preferably, the silicon nitride particles consists of >90% alpha nitride and fall in the size range 0.1 to 2 microns size and more preferred in the size range 0.4 to 1.0 micron. The specific surface area of the silicon nitride powder is preferably 9-15 $m^2/g$.

Preferably, the carbon source represents 1 to 15 wt % of the composition, and the oxide represents 2 to 25 wt% of the composition A preferred composition comprises 2 wt % carbon black and 10 wt % microsilica, the balance being silicon nitride. Preferably the silicon powder represents 2 to 15 wt % of the composition. The purpose of carbon, oxide and Si-powder addition is to favor the formation of silicon oxynitride and/or silicon carbide, which will provide a reaction product that acts as a bonding agent between the silicon nitride particles themselves and between silicon nitride and graphite.

Preferably, the coating composition is deployed as a liquid or slurry. It is more preferably dispersed in a liquid, which is preferably water. Preferably, the composition is an aqueous dispersion and further includes a binder, preferably an organic binder. The binder may be present as 0 to 70 wt %, based on the weight of dry solids, and is preferably an aqueous solution of polyvinyl alcohol (PVA). Another suitable binder is polyethylene glycol. The dispersion may also include a dispersant. Suitable dispersants include polyacrylate salts of ammonium or sodium. The dispersant may be present as 0.1 to 5 wt % based on the weight of solids and more preferred in an amount of 0.2-1.0 wt % based on the weight of solids.

The invention also extends to a method of coating a mould for the directional solidification of silicon, which comprises applying a coating composition as described to the inner surface of the mould to form a mould coating. Preferably the coating application is applied as an aqueous suspension. It may be applied by painting, spraying or dipping. It may be deployed as a series of sub-layers which are applied sequentially. The final thickness of the coating is preferably from 50 to 1000 microns, more preferably from 150 to 300 microns.

In addition, the coating may be covered by a further layer or layers. The invention therefore contemplates the further step of applying a top layer composition to the base mould coating. Preferably, the top layer composition comprises silicon nitride and/or silicon carbide. Preferably, the silicon nitride represents 0 to 50 wt % of the top layer composition and the balance is silicon carbide. The top layer may be applied in the form of an aqueous suspension and by any convenient technique. It may include a binder, such as PVA.

The purpose of the base layer is to provide a dense tightly bonded layer on the surface of the mould which prevent metal infiltration. The objective of the top layer is to prevent metal infiltration and to provide easy release between ingot and mould.

In addition to a top coat, there may also be an intermediate coat or layer, between the base layer or basic coating and the top layer. The method of the invention may therefore also include the further step of applying an intermediate layer between the mould coating and the top layer. Preferably, the intermediate layer composition comprises silicon nitride. Preferably, the intermediate layer composition is applied as an aqueous suspension.

The invention also extends to a mould (or crucible) per se, comprising a mould body coated with a coating composition as described, optionally applied by a method as described.

DETAILED DESCRIPTION OF THE INVENTION

The invention may be carried into practice in various ways and some embodiments will now be described in the following non-limiting examples.

EXAMPLE 1

A coating composition comprising 10 wt % microsilica, 2 wt % carbon black and 88% silicon nitride was prepared as an aqueous dispersion with water, together with a solution of PVA as a binder and a polyacrylate salt of sodium in an amount of 0.5 wt % based on the weight of dry solids as a dispersant. The dispersion was applied to a graphite mould inner surface, as a series multiple sub layers, each sub-layer being allowed to dry before application of the next.

The mould was filled with molten silicon held at a temperature of 1450° C. and then slowly cooled from the bottom. Upon directional solidification, the silicon ingot was easily removed, without damage to the mould, and without any silicon infiltration, and the mould was immediately re-usable.

EXAMPLE 2

A mould was coated as in Example 1, but before filling the mould with molten silicon, a top layer of pure silicon nitride was applied, as an aqueous dispersion. After heating at 1450° C., the silicon was slowly cooled from the bottom. Upon solidification the silicon ingot was easily removed. Again, this was without damage to the mould, and without any silicon infiltration, and the mould was immediately re-usable.

EXAMPLE 3

A mould was coated as in Example 1, but before filling the mould with molten silicon an additional layer consisting of more that 90% by weight of silicon carbide, the remaining being silicon nitride was applied on top of the base layer. After heating at 1450° C. the silicon was slowly cooled from the bottom. Upon solidification the silicon ingot was easily removed from the mould and the mould was ready for re-use.

The invention claimed is:

1. A coating composition for a mould for the directional solidification of silicon, which comprises silicon nitride particles, a carbon and an oxide and/or silicon powder, wherein the carbon represents from 1 to 20 wt %, the oxide represents 0.5 to 48 wt %, the silicon powder represents 1 to 20 wt % and silicon nitride represents at least 51 wt % and is the balance of the composition.

2. The composition of claim 1, wherein the oxide is $SiO_2$.

3. The composition of claim 2, wherein the $SiO_2$ is amorphous microsilica.

4. The composition of claim 2, wherein the $SiO_2$ is amorphous fumed silica.

5. The composition of claim 1, wherein the carbon is carbon black.

6. The composition of claim 1, wherein the silicon nitride particles fall in the size range 0.1 to 2 microns.

7. The composition of claim 6, wherein the silicon nitride particles fall in the size range 0.4 to 1 microns.

8. The composition of claim 1, wherein the carbon represents 1 to 15 wt % of the composition.

9. The composition of claim 1, wherein the oxide represents 2 to 25 wt % of the composition.

10. The composition of claim 1, wherein the silicon powder represents 2 to 15 wt % of the composition.

11. The composition of claim 1, dispersed in a liquid.

12. The composition of claim 11, wherein the liquid is water.

13. The composition of claim 12, wherein the composition is an aqueous dispersion and further includes a binder.

14. The composition of claim 13, wherein the binder is present as up to 46 wt %, based on the weight of dry solids.

15. The composition of claim 1, further comprising a dispersant.

16. The composition of claim 15, wherein the dispersant is present as 0.1 to 5 wt % based on the weight of dry solids.

17. The composition of claim 16, wherein the dispersant is present as 0.2 to 1 wt % based on the weight of dry solids.

18. A coating composition for a mould for the directional solidification of silicon, which comprises silicon nitride particles, a carbon and an oxide and/or silicon powder, wherein the carbon represents 2 wt % carbon black and the oxide represents 10% microsilica, the silicon nitride represents at least 51 wt % and is the balance of the composition.

19. A coating composition for a mould for the directional solidification of silicon, which comprises silicon nitride particles, a carbon and an oxide and/or silicon powder; the carbon represents from 1 to 20 wt %, the oxide represents 0.5 to 47 wt %, the silicon powder represents 1 to 20 wt % and silicon nitride represents at least 51 wt % and is the balance of the composition, wherein the composition is an aqueous dispersion and further include a binder, and the binder is polyvinylalcohol.

20. A coating composition for a mould for the directional solidification of silicon, which comprises silicon nitride particles, a carbon and an oxide and/or silicon powder; the carbon represents from 1 to 20 wt %, the oxide represents 0.5 to 47 wt %, the silicon powder represents 1 to 20 wt % and silicon nitride represents at least 51 wt % and is the balance of the composition, wherein the composition is an aqueous dispersion and further include a binder, and the binder is polyethylene glycol.

21. A coating composition for a mould for the directional solidification of silicon, which comprises silicon nitride particles, a carbon and an oxide and/or silicon powder; the carbon represents from 1 to 20 wt %, the oxide represents 0.5 to 47 wt %, the silicon powder represents 1 to 20 wt % and silicon nitride represents at least 51 wt % and is the balance of the composition; wherein the composition further comprises a dispersant and the dispersant is a polyacrylate salt of ammonium or sodium.

* * * * *